United States Patent
Liao

(10) Patent No.: US 10,468,621 B2
(45) Date of Patent: Nov. 5, 2019

(54) ORGANIC LIGHT-EMITTING DIODE DISPLAY SUBSTRATE, AND DISPLAY APPARATUS AND PRODUCTION METHOD THEREOF

(71) Applicant: BOE TECHNOLOGY GROUP CO., LTD., Beijing (CN)

(72) Inventor: Chinlung Liao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 211 days.

(21) Appl. No.: 15/720,547

(22) Filed: Sep. 29, 2017

(65) Prior Publication Data
US 2018/0190921 A1 Jul. 5, 2018

(30) Foreign Application Priority Data

Dec. 30, 2016 (CN) .......................... 2016 1 1262728

(51) Int. Cl.
*H01L 51/00* (2006.01)
*H01L 51/50* (2006.01)
(Continued)

(52) U.S. Cl.
CPC ............ *H01L 51/504* (2013.01); *C09K 11/06* (2013.01); *H01L 27/322* (2013.01);
(Continued)

(58) Field of Classification Search
None
See application file for complete search history.

(56) References Cited

U.S. PATENT DOCUMENTS 7,030,554 B2 * 4/2006 Liao ................... H01L 27/3211
  313/504
7,859,186 B2 * 12/2010 Noh ....................... C09K 11/06
  313/500
(Continued)

FOREIGN PATENT DOCUMENTS

CN 103730585 A 4/2014
CN 104022229 A 9/2014
(Continued)

OTHER PUBLICATIONS

First Chinese Office Action dated Jul. 31, 2017, for corresponding Chinese Application No. 201611262728.7.
(Continued)

*Primary Examiner* — Robert S Loewe
(74) *Attorney, Agent, or Firm* — Kinney & Lange, P.A.

(57) ABSTRACT

This disclosure provides an organic light-emitting diode display substrate, and a display apparatus and a production method thereof. The organic light-emitting diode display substrate of this disclosure comprises a blue pixel and a first color pixel, wherein first color light-emitting unit is provided in the first color pixel, and the first color light-emitting unit sequentially comprises a first electrode, a first functional layer, a first color light-emitting layer, a first carrier generation layer, a first blue light-emitting layer, a second carrier generation layer, a second blue light-emitting layer, a second functional layer, and a second electrode in a first direction, and comprises a first color filter; and a blue light-emitting unit is provided in the blue pixel, and the blue light-emitting unit sequentially comprises the first electrode, the first functional layer, the first carrier generation layer, the first blue light-emitting layer, the second carrier generation layer, the second blue light-emitting layer, the second functional layer, and the second electrode in the first direction.

20 Claims, 2 Drawing Sheets

(51) Int. Cl.
  *H01L 27/32* (2006.01)
  *C09K 11/06* (2006.01)
  *H01L 51/56* (2006.01)

(52) U.S. Cl.
  CPC ...... *H01L 27/3211* (2013.01); *H01L 51/5044* (2013.01); *H01L 51/5092* (2013.01); *H01L 51/5056* (2013.01); *H01L 51/5072* (2013.01); *H01L 51/56* (2013.01); *H01L 2251/303* (2013.01); *H01L 2251/558* (2013.01)

(56) References Cited

U.S. PATENT DOCUMENTS

| | | | |
|---|---|---|---|
| 7,948,163 B2 | 5/2011 | Parthasarathy et al. | |
| 8,877,350 B2* | 11/2014 | Spindler | H01L 51/5036 257/40 |
| 9,231,034 B1* | 1/2016 | Chen | H01L 27/3218 |
| 2005/0093435 A1* | 5/2005 | Suh | H01L 27/322 313/504 |
| 2006/0017377 A1* | 1/2006 | Ryu | H01L 51/5265 313/504 |
| 2006/0105201 A1* | 5/2006 | Lee | H01L 27/3211 428/690 |
| 2007/0001588 A1* | 1/2007 | Boroson | H01L 27/3209 313/504 |
| 2008/0231174 A1 | 9/2008 | Parthasarathy et al. | |
| 2010/0163854 A1* | 7/2010 | Kho | H01L 51/504 257/40 |
| 2011/0240965 A1* | 10/2011 | Yoon | H01L 27/3211 257/40 |
| 2012/0025225 A1* | 2/2012 | Oda | H01L 27/3211 257/89 |
| 2012/0025226 A1* | 2/2012 | Oda | H01L 27/3211 257/89 |
| 2012/0261683 A1* | 10/2012 | Sonoyama | H01L 27/3211 257/89 |
| 2013/0001531 A1 | 1/2013 | Park et al. | |
| 2013/0168652 A1* | 7/2013 | Nam | H01L 51/50 257/40 |
| 2014/0084256 A1* | 3/2014 | Kim | H01L 51/504 257/40 |
| 2014/0084269 A1* | 3/2014 | Weaver | H01L 27/3209 257/40 |
| 2014/0374707 A1* | 12/2014 | Seo | H01L 27/3211 257/40 |
| 2015/0144926 A1* | 5/2015 | Lee | H01L 51/5265 257/40 |
| 2015/0188073 A1* | 7/2015 | Ahn | H01L 27/3209 257/40 |
| 2015/0188074 A1* | 7/2015 | Heo | H01L 51/5044 257/40 |
| 2015/0303380 A1* | 10/2015 | Kambe | C07D 487/14 257/40 |
| 2015/0333296 A1* | 11/2015 | Lee | H01L 51/5064 257/40 |
| 2015/0380470 A1* | 12/2015 | Lee | H01L 27/3213 257/40 |
| 2016/0276602 A1* | 9/2016 | Yoshinaga | C09K 11/06 |
| 2016/0293676 A1* | 10/2016 | Komatsu | G02B 5/20 |
| 2017/0125494 A1* | 5/2017 | Matsusue | H01L 51/5044 |
| 2017/0200771 A1* | 7/2017 | Sung | H01L 27/3213 |

FOREIGN PATENT DOCUMENTS

| | | |
|---|---|---|
| CN | 104425736 A | 3/2015 |
| CN | 104681734 A | 6/2015 |
| CN | 105027313 A | 11/2015 |
| CN | 106058066 A | 10/2016 |
| KR | 20140124095 A | 10/2014 |

OTHER PUBLICATIONS

Chinese Search Report, for Chinese Patent Application No. 201611262728.7, dated May 28, 2017, 11 pages.
Second Chinese Office Action, for Chinese Patent Application No. 201611262728.7, dated Nov. 16, 2017, 11 pages.

* cited by examiner

ORGANIC LIGHT-EMITTING DIODE DISPLAY SUBSTRATE, AND DISPLAY APPARATUS AND PRODUCTION METHOD THEREOF

TECHNICAL FIELD

This disclosure belongs to the technical field of organic light-emitting diode display, and particularly relates to an organic light-emitting diode display substrate, and a display apparatus and a production method thereof.

BACKGROUND

In an existing process of producing an organic light-emitting diode display substrate by a solution evaporation hybrid method (hybrid process), color filters for corresponding colors should be further provided in pixels of various colors in order to ameliorate the color gamut. Light emitted from a light-emitting layer is filtered by a color filter. Due to limits by processes and materials, the light-emitting efficiency of existing blue light-emitting layers is relatively low. In order to ensure that there is a sufficient brightness after filtered by a blue color filter, the current therein is required to be increased, thereby leading to high energy consumption and short service life of blue pixels of organic light-emitting diode display substrates.

SUMMARY

This disclosure provides an organic light-emitting diode display substrate, comprising a blue pixel and a first color pixel, wherein wherein a first color light-emitting unit is provided in the first color pixel, and the first color light-emitting unit sequentially comprises a first electrode, a first functional layer, a first color light-emitting layer, a first carrier generation layer, a first blue light-emitting layer, a second carrier generation layer, a second blue light-emitting layer, a second functional layer, and a second electrode in a first direction, and comprises a first color filter for a first color light filtering through; and a blue light-emitting unit is provided in the blue pixel, and the blue light-emitting unit sequentially comprises the first electrode, the first functional layer, the first carrier generation layer, the first blue light-emitting layer, the second carrier generation layer, the second blue light-emitting layer, the second functional layer, and the second electrode in the first direction.

Preferably, the materials of the first carrier generation layer and second carrier generation layer are each independently a metal, an oxide, or an organic matter.

Preferably, the materials of the first carrier generation layer and second carrier generation layer are each independently a material doped with 1 to 10 wt % of metal lithium and selected from the group consisting of 4,7-diphenyl-1,10-phenanthroline, 2,9-bis(naphth-2-yl)-4,7-diphenyl-1,10-phenanthroline, 2,9-dimethyl-4,7-diphenyl-1,10-phenanthroline, 2-(4-biphenylyl)-5-phenyl-1,3,4-oxadiazole, 2-(4-biphenylyl)-5-(4-t-butylphenyl)-1,3,4-oxadiazole, 3-(biphenyl-4-yl)-5-(4-t-butylphenyl)-4-phenyl-4H-1,2,4-triazole, 1,3,5-tris(1-phenyl-1H-benzimidazol-2-yl)benzene, quinoxaline derivatives, triphenylquinoline, acridine derivatives, 2,6-bis(biphenyl)-4,8-diphenylanthrazoline, phenanthroline derivatives, aluminum 8-hydroxyquinolinate, and combinations thereof.

Preferably, the thicknesses of the first carrier generation layer and the second carrier generation layer are each independently between 5 and 20 nm.

Preferably, the organic light-emitting diode display substrate further comprises a second color pixel, wherein a second color light-emitting unit is provided in the second color pixel, and the second color light-emitting unit sequentially comprises the first electrode, the first functional layer, a second color light-emitting layer, the first carrier generation layer, the first blue light-emitting layer, the second carrier generation layer, the second blue light-emitting layer, the second functional layer, and the second electrode in the first direction, and comprises a second color filter for a second color light filtering through.

Preferably, the first electrode is an anode and the second electrode is a cathode; and the first functional layer comprises a hole injection layer and a hole transport layer, in which the hole injection layer is closer to the anode; and/or the second functional layer comprises an electron transport layer and an electron injection layer, in which the electron injection layer is closer to the cathode.

Preferably, the material of the hole injection layer is poly(3,4-ethylenedioxythiophene)-polystyrenesulfonic acid, polythiophene, or polyaniline.

Preferably, the material of the hole transport layer is an aromatic diamine compound, a triphenylamine compound, an aromatic triamine compound, a biphenyldiamine derivative, a triarylamine polymer, or a carbazole polymer.

Preferably, the material of the electron injection layer is lithium fluoride or lithium 8-hydroxyquinolinate.

Preferably, the material of the electron transport layer is selected from the group consisting of 4,7-diphenyl-1,10-phenanthroline, 2,9-bis(naphth-2-yl)-4,7-diphenyl-1,10-phenanthroline, 2,9-dimethyl-4,7-diphenyl-1,10-phenanthroline, 2-(4-biphenylyl)-5-phenyl-1,3,4-oxadiazole, 2-(4-biphenylyl)-5-(4-t-butylphenyl)-1,3,4-oxadiazole, 3-(biphenyl-4-yl)-5-(4-t-butylphenyl)-4-phenyl-4H-1,2,4-triazole, 1,3,5-tris(1-phenyl-1H-benzimidazol-2-yl)benzene, quinoxaline derivatives, triphenylquinoline, acridine derivatives, 2,6-bis(biphenyl)-4,8-diphenylanthrazoline, phenanthroline derivatives, aluminum 8-hydroxyquinolinate, and combinations thereof.

Preferably, the organic light-emitting diode display substrate further comprises a base, and the first electrode is disposed at a position closer to the base than the second electrode is.

Preferably, the blue pixel further comprises a blue color filter.

Preferably, a first additional electron transport layer and a first additional hole transport layer are further provided on both sides of the first carrier generation layer respectively; and/or a second additional electron transport layer and a second additional hole transport layer are further provided on both sides of the second carrier generation layer respectively.

Preferably, the material of the first additional electron transport layer or the material of the second additional electron transport layer is selected from the group consisting of 4,7-diphenyl-1,10-phenanthroline, 2,9-bis(naphth-2-yl)-4,7-diphenyl-1,10-phenanthroline, 2,9-dimethyl-4,7-diphenyl-1,10-phenanthroline, 2-(4-biphenylyl)-5-phenyl-1,3,4-oxadiazole, 2-(4-biphenylyl)-5-(4-t-butylphenyl)-1,3,4-oxadiazole, 3-(biphenyl-4-yl)-5-(4-t-butylphenyl)-4-phenyl-4H-1,2,4-triazole, 1,3,5-tris(1-phenyl-1H-benzimidazol-2-yl)benzene, quinoxaline derivatives, triphenylquinoline, acridine derivatives, 2,6-bis(biphenyl)-4,8-diphenylanthrazoline, phenanthroline derivatives, aluminum 8-hydroxyquinolinate, and combinations thereof.

Preferably, the material of the first additional hole transport layer or the material of the second additional hole transport layer comprises N,N'-diphenyl-N,N'-di(2-naphthyl)-1,1'-biphenyl-4,4'-diamine.

This disclosure also provides an organic light-emitting diode display apparatus, comprising:

the organic light-emitting diode display substrate described above.

This disclosure also provides a production method of an organic light-emitting diode display substrate described above, wherein the first color light-emitting layer is formed by a solution method; and the first blue light-emitting layer and the second blue light-emitting layer are formed by an evaporation method.

Preferably, the first electrode is an anode and the second electrode is a cathode;

the first functional layer comprises a hole injection layer and a hole transport layer, in which the hole injection layer is closer to the anode;

the second functional layer comprises an electron transport layer and an electron injection layer, in which the electron injection layer is closer to the cathode;

wherein the first functional layer is formed by a solution method; and the second functional layer is formed by an evaporation method.

Preferably, the first carrier generation layer and the second carrier generation layer are formed by an evaporation method.

Preferably, a first additional electron transport layer and a first additional hole transport layer are further formed on both sides of the first carrier generation layer respectively by an evaporation method; and/or a second additional electron transport layer and a second additional hole transport layer are further formed on both sides of the second carrier generation layer respectively by an evaporation method.

DETAILED DESCRIPTION

Figure 1:
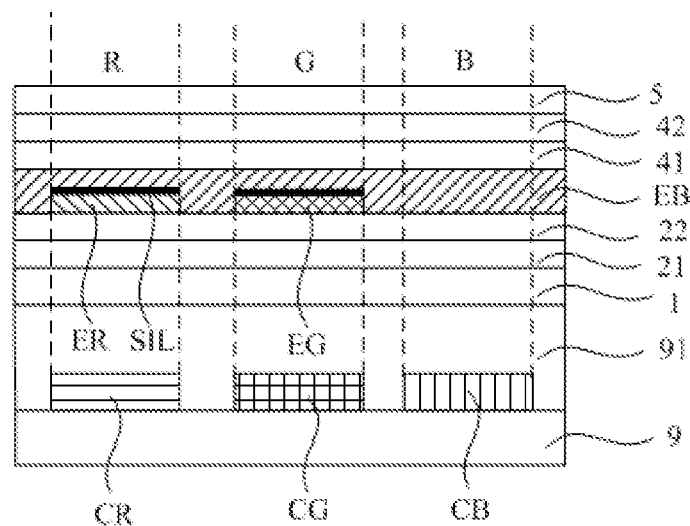
FIG. 1 is a schematic diagram of the partial sectional structure of an existing organic light-emitting diode display substrate.

In order to allow the person skilled in the art to better understand the technical solution of this disclosure, this disclosure will be further described in detail below in conjunction with accompanying drawings and specific embodiments.

In the accompanying drawings, the reference numerals are as follows: 1, anode; 2, first functional layer; 21, hole injection layer; 22, hole transport layer; 3, carrier generation layer; 31, first carrier generation layer; 32, second carrier generation layer; 4, second functional layer; 41, electron transport layer; 42, electron injection layer; 5, cathode; 9, base; 91, planarizing layer; R, red pixel; G, green pixel; B, blue pixel; CR, red color filter; CG, green color filter; CB, blue color filter; ER, red light-emitting layer; EG, green light-emitting layer; EB, blue light-emitting layer; EB1, first blue light-emitting layer; EB2, second blue light-emitting layer; SIL, insulating layer;

As shown in FIG. 1, in an existing organic light-emitting diode display substrate produced by a solution method (hybrid process), a red light-emitting layer ER and a green light-emitting layer EG are provided in a red pixel R and a green pixel G respectively, and at the meanwhile, a blue light-emitting layer EB superimposed upon the red light-emitting layer ER and the green light-emitting layer EG is further provided. In order to prevent quenching of triplet excitons of the red light-emitting layer ER and the green light-emitting layer EG, an insulating layer SIL is further provided between each of them and the blue light-emitting layer EB. This insulating layer SIL may be composed of a hole transport material. However, there is only a blue light-emitting layer EB in the blue pixel B. Therefore, color filters for corresponding colors should be further provided in pixels of various colors in order to ameliorate the color gamut of the organic light-emitting diode display substrate. Light emitted from a light-emitting layer will be filtered by a color filter.

This disclosure may at least solve existing problems of high energy consumption and short service life of blue pixels of organic light-emitting diode display substrates, and provides an organic light-emitting diode display substrate having low energy consumption and long service life of blue pixels, and a display apparatus and a production method thereof.

In the organic light-emitting diode display substrate of this disclosure, a carrier generation layer is further provided in the blue pixel. That is, the light-emitting layer of the blue pixel has a stacked structure and thus has a higher light-emitting efficiency, so that corresponding blue pixels may have low energy consumption and long service life.

Example 1

Figure 2:
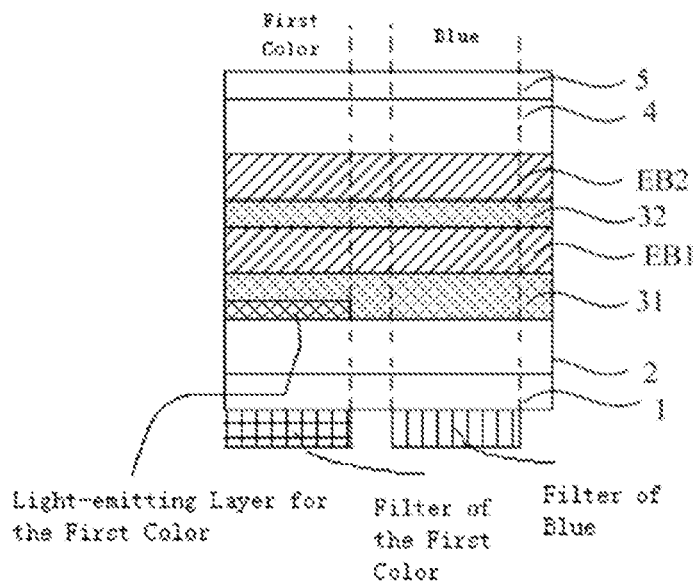
FIG. 2 is a schematic diagram of the partial sectional structure of an organic light-emitting diode display substrate in an example of this disclosure.

As shown in FIG. 2, this Example provides an organic light-emitting diode display substrate, comprising a blue pixel and a first color pixel, wherein a first color light-emitting unit is provided in the first color pixel, and the first color light-emitting unit sequentially comprises a first electrode 1, a first functional layer 2, a first color light-emitting layer, a first carrier generation layer 31, a first blue light-emitting layer EB1, a second carrier generation layer 32, a second blue light-emitting layer EB2, a second functional layer 4, and a second electrode 5 in a first direction (vertical direction, from bottom to top), and further comprises a first color filter for a first color light filtering through; and a blue light-emitting unit is provided in the blue pixel, and the blue light-emitting unit sequentially comprises the first electrode 1, the first functional layer 2, the first carrier generation layer 31, the first blue light-emitting layer EB1, the second carrier generation layer 32, the second blue light-emitting layer EB2, the second functional layer 4, and the second electrode 5 in the first direction. A blue color filter is further comprised as shown in the figure, but the blue color filter is optional.

It is to be understood that although the color filters are in the lowermost position as shown in the figure, they may be in other positions, as long as they have the function of light filtering.

In the organic light-emitting diode display substrate of this Example, a carrier generation layer is further provided in the blue pixel. That is, the light-emitting layer of the blue pixel has a stacked structure and thus has a higher light-emitting efficiency, so that corresponding blue pixels may have low energy consumption and long service life.

Example 2

Figure 3:
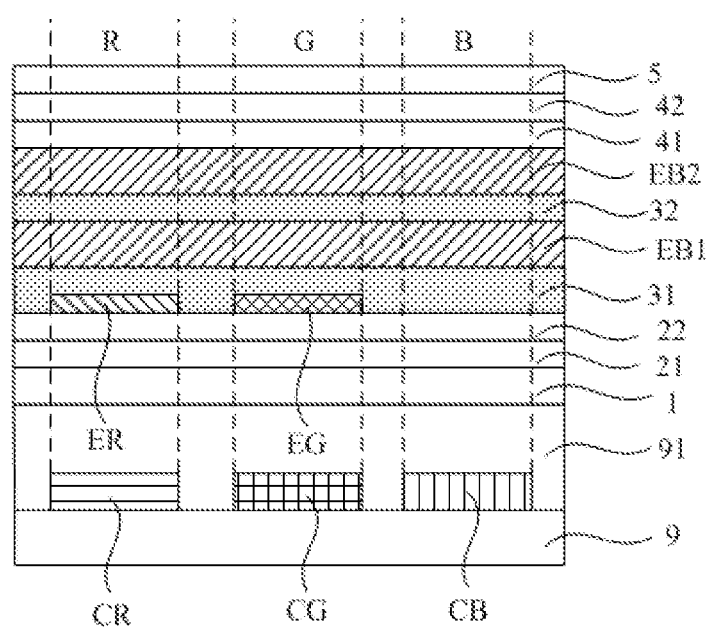
FIG. 3 is a schematic diagram of the partial sectional structure of an organic light-emitting diode display substrate in another example of this disclosure.

As shown in FIG. 3, this Example provides an organic light-emitting diode (OLED) display substrate, comprising a blue pixel B, a first color pixel, and a second color pixel.

More preferably, one of the first color and the second color is red, and the other one is green.

That is, the organic light-emitting diode display substrate of this Example may be a conventional organic light-emitting diode display substrate having three colors including red, green, and blue. In this Example, illustration is made by exemplifying a case that the first color is red and the second color is green. Of course, it is to be understood that it may also be a case that the first color is green, the second color is red, and the organic light-emitting diode display substrate may further comprise pixels of other colors such as a yellow pixel, a white pixel, and the like.

In the organic light-emitting diode display substrate of this Example:

a red light-emitting unit is provided in the red pixel R, and the red light-emitting unit sequentially comprises a first electrode 1, a first functional layer (21+22), a red light-emitting layer ER, a first carrier generation layer 31, a first blue light-emitting layer EB1, a second carrier generation layer 32, a second blue light-emitting layer EB2, a second functional layer (41+42), and a second electrode 5 in a first direction (direction perpendicular to a base 9), and comprises a red color filter CR;

a blue light-emitting unit is provided in the blue pixel B, the blue light-emitting unit sequentially comprises a first electrode 1, a first functional layer (21+22), a first carrier generation layer 31, a first blue light-emitting layer EB1, a second carrier generation layer 32, a second blue light-emitting layer EB2, a second functional layer (41+42), and a second electrode 5 in the first direction, and optionally further comprises a blue color filter CB;

a green light-emitting unit is provided in the green pixel G, and the green light-emitting unit sequentially comprises a first electrode 1, a first functional layer (21+22), a green light-emitting layer EG, a first carrier generation layer 31, a first blue light-emitting layer EB1, a second carrier generation layer 32, a second blue light-emitting layer EB2, a second functional layer (41+42), and a second electrode 5 in the first direction, and comprises a green color filter CG.

That is, as shown in FIG. 3, a first functional layers and a second functional layer are consistently provided in pixels of different colors, and light-emitting layers of corresponding colors are provided in the pixels of various colors respectively. A blue light-emitting layer is also provided in the red pixel R and the green pixel G, but light emitted therefrom will be filtered by a corresponding color filter, so that the color of the corresponding pixel is not affected. At the meanwhile, the blue light-emitting layer is not a single layer, but a stacked structure which formed by a first carrier generation layer 31, a first blue light-emitting layer EB1, a second carrier generation layer 32, and a second blue light-emitting layer EB2, which are superimposed.

Here, the carrier generation layer (CGL) is also referred to as a charge generation layer (CGL), and the material thereof may be a metal, an oxide, an organic matter, and the like. Under the action of an externally applied electric field, the carrier generation layer can generate electrons and holes concurrently, and thus may act as an anode 1 and a cathode 5 respectively with respect to the light-emitting layers on both sides. Thus, it actually corresponds to a case that two blue organic light-emitting diodes are formed in the blue light-emitting unit of the blue pixel B having a stacked structure, and thus the light-emitting efficiency is higher, so that the blue pixel B has reduced energy consumption and elongated service life.

Further, in the organic light-emitting diode display substrate of this Example, each of the red light-emitting layer ER and the green light-emitting layer EG is only located in the pixel of the corresponding color, and they may be produced by a solution method, such as a printing method. Since the blue light-emitting layer is also provided in the red pixel R and the green pixel G, the blue light-emitting layer is a complete layer overlaying the entire base 9 and may be produced by an evaporation process.

Preferably, the first electrode is an anode 1 and the second electrode is a cathode 5; the first functional layer comprises a hole injection layer 21 and a hole transport layer 22, in which the hole injection layer 21 is closer to the anode 1; the second functional layer comprises an electron transport layer 41 and an electron injection layer 42, in which the electron injection layer 42 is closer to the cathode 5.

That is, the blue light-emitting layer is preferably located at a side of a light-emitting layer of another color closer to the cathode 5. Here, when the first electrode is an anode 1, the first functional layer adjacent thereto is correspondingly a hole injection layer 21 (HIL) and a hole transport layer 22 (HTL), while the second functional layer adjacent to the second electrode (cathode 5) is correspondingly an electron injection layer 42 (EIL) and an electron transport layer 41 (ETL).

In the prior art, hole transport layers in the red pixel and the blue pixel are produced by a solution method. However, the matching between the hole transport layer produced by a solution method and the blue light-emitting layer produced by evaporation is poor, and a hole transport layer is required to be separately formed for the blue pixel by an evaporation method. In this disclosure, since the blue light-emitting layer has a stacked structure, in which the first blue light-emitting layer EB1 is not in contact with the hole transport layer 22 any longer but is in contact with the first carrier generation layer 31, the separately produced hole transport layer may not be used for the blue pixel B, and the entire hole transport layer 22 (first functional layer) is formed by a solution method. Thereby, the problem that the blue light-emitting layer formed by an evaporation method does not match the hole transport layer formed by a solution method has been solved, and the process of production is simplified.

Preferably, a first additional electron transport layer and a first additional hole transport layer are further provided on both sides of the first carrier generation layer 31 respectively; and a second additional electron transport layer and a second additional hole transport layer are further provided on both sides of the second carrier generation layer 32 respectively.

In order to allow the carrier generation layer to have a better function of transport, an electron transport layer and a hole transport layer may be additionally provided on both sides thereof. Of course, since the carrier generation layer is a connecting layer between two light-emitting layers and needs to act as a cathode and an anode concurrently, with respect to any carrier generation layer, additional layers on both sides thereof should be configured such that the hole transport layer is closer to the cathode so as to act as the anode of the light-emitting layer on this side, while the electron transport layer is closer to the anode so as to act as the cathode of the light-emitting layer on that side.

Preferably, the organic light-emitting diode display substrate further comprises a base 9, and the first electrode is disposed in a position closer to the base 9 than the second electrode is.

That is, as shown in FIG. 3, in the organic light-emitting diode display substrate, it is preferable to sequentially form a first electrode, a first functional layer, and a red light-emitting layer ER/green light-emitting layer EG, and then form a blue light-emitting layer comprising a carrier generation layer, a second functional layer, a second electrode, and the like.

A red color filter CR, a green color filter CG, and an optional blue color filter CB are also formed in appropriate positions. Since blue light-emitting layers exist in both red and green pixels and the light emitted from the light-emitting layer of each color cannot be completely pure light having a wavelength of the corresponding color, from the view point of the enlargement of the color gamut, a red color filter CR is provided in the red pixel R, a green color filter CG is provided in the green pixel G, and a blue color filter CB is optionally provided in the blue pixel B. Since a part of light emitted from the light-emitting layer will be filtered off by the color filter, it will result in the reduction of the light-emitting efficiency. It has the most serious influence on the blue light-emitting layer which inherently has a relatively low light-emitting efficiency, possibly leading to high energy consumption and reduced service life. In this Example, since the blue light-emitting layer has a stacked structure and thus has a relatively high light-emitting efficiency, the energy consumption and the service life thereof will not be affected even if the color filter is used.

Of course, in order to ensure the filtering of all lights emitted, in each pixel, each color filter is preferably closer to the light emergent side of the organic light-emitting diode display substrate than the light-emitting unit (including the electrode, the functional layer, the light-emitting layer, and the like) is. For example, as for the organic light-emitting diode display substrate as shown in FIG. 3, if it is in a bottom-emission mode (that is, light is emitted from the base 9), the color filter may be closer to the base 9 than the organic light-emitting diode is.

Of course, in the organic light-emitting diode display substrate, other structures, such as a drive circuit for driving display of various pixels, a planarizing layer 91, and the like may be further provided, and detailed description is omitted hereby.

This Example further provides an organic light-emitting diode display apparatus, comprising:

the organic light-emitting diode display substrate described above.

Particularly, this display apparatus may be any product or member having the function of display, such as a cell phone, a tablet computer, a television, a display, a laptop, a digital photo frame, a navigator, etc.

Example 3

This Example provides a production method of an organic light-emitting diode display substrate described above, wherein the first light-emitting layer, such as a red light-emitting layer ER, is formed by a solution method, and of course, if there is a green light-emitting layer EG as the second light-emitting layer, it is should be also produced by a solution method; and the first blue light-emitting layer EB1 and the second blue light-emitting layer EB2 are formed by an evaporation method.

That is, in the organic light-emitting diode display substrate described above, the blue light-emitting layer (the first blue light-emitting layer EB1 and the second blue light-emitting layer EB2) may be produced by an evaporation method, while the light-emitting layers of other colors, such as the red light-emitting layer ER, the green light-emitting layer EG, and the like, may be produced by a solution method.

In this Example, since the blue light-emitting layer has a stacked structure and thus has a relatively high light-emitting efficiency, it is possible to have relatively low energy consumption and relatively long service life even if an evaporation method is used for production.

Preferably, when the first functional layer is a hole injection layer 21 and a hole transport layer 22 and the second functional layer is an electron transport layer 41 and an electron injection layer 42 in the organic light-emitting diode display substrate, the first functional layer is formed by an solution method and the second functional layer is formed by an evaporation method.

That is, the hole injection layer 21 and the hole transport layer 22 described above may be formed by an solution method, and the electron transport layer 41 and the electron injection layer 42 may be formed by an evaporation method. In this case, since the blue light-emitting layer has a stacked structure and the first carrier generation layer 31 is in contact with the first blue light-emitting layer EB1, the hole transport layer 22 produced by a solution method can still match the blue light-emitting layer produced by an evaporation method.

More preferably, the first carrier generation layer 31 and the second carrier generation layer 32 are formed by an evaporation method.

That is, various carrier generation layers described above may also be formed by an evaporation method.

Particularly, a production method of an organic light-emitting diode display substrate in this Example comprises the following steps.

S201, forming a drive circuit and a planarizing layer 91 on a base 9.

That is, a drive circuit (comprising a thin-film transistor, a gate line, a data line, and the like) for driving display of various pixels is formed on a base 9, which is covered by forming a planarizing layer 91, in order to continue to form a light-emitting unit thereon in subsequent steps. The color filters may be provided in the planarizing layer.

S202, forming an anode 1.

An anode 1 is formed by a method such as chemical vapor deposition and the like, the thickness thereof may be about 70 nm, and the material may be indium tin oxide (ITO) and the like.

S203, forming a first functional layer by a solution method.

That is, a hole injection layer 21 and a hole transport layer 22 are sequentially formed by a solution method.

Here, the hole injection layer 21 may have a thickness of about 20 nm, and the material thereof may be poly(3,4-ethylenedioxythiophene)-polystyrenesulfonic acid, polythiophene, polyaniline, and the like.

The hole transport layer 22 may have a thickness of about 20 nm, and the material thereof may be an aromatic diamine compound, a triphenylamine compound, an aromatic triamine compound, a biphenyldiamine derivative, a triarylamine polymer, a carbazole polymer, and the like.

S204, forming a first functional layer by a solution method.

That is, a red light-emitting layer ER and a green light-emitting layer EG are formed in a red pixel R and a green pixel G respectively by a solution process such as a printing method and the like.

Here, the red light-emitting layer ER may have a thickness of about 60 nm, and the material thereof may be 4,4'-bis(N-carbazole)-1,1'-biphenyl doped with 5,6,11,12-tetraphenyltetracene, wherein the mass ratio of 4,4'-bis(N-carbazole)-1,1'-biphenyl to 5,6,11,12-tetraphenyltetracene may be 97:3.

The green light-emitting layer EG may have a thickness of about 60 nm, and the material thereof may be 1,3,5-tris(bromomethyl)benzene doped with N,N'-dimethylquinacridone, wherein the mass ratio of 1,3,5-tris(bromomethyl)benzene to N,N'-dimethylquinacridone may be 85:15.

S205, sequentially forming a first additional electron transport layer, a first carrier generation layer 31, and a first additional hole transport layer by an evaporation method.

That is, a first carrier generation layer 31 is formed in the pixel of each color by a method of vacuum deposition, and on both sides thereof, a first additional electron transport layer located under the first carrier generation layer 31 and a first additional hole transport layer located on the first carrier generation layer 31 are formed, respectively.

Here, the first additional electron transport layer may have a thickness of about 20 nm, and the material thereof may comprise any one or a combination of 4,7-diphenyl-1,10-phenanthroline, 2,9-bis(naphth-2-yl)-4,7-diphenyl-1,10-phenanthroline, 2,9-dimethyl-4,7-diphenyl-1,10-phenanthroline, 2-(4-biphenylyl)-5-phenyl-1,3,4-ox adiazole, 2-(4-biphenylyl)-5-(4-t-butylphenyl)-1,3,4-oxadiazole, 3-(biphenyl-4-yl)-5-(4-t-butylphenyl)-4-phenyl-4H-1,2,4-triazole, 1,3,5-tris(1-phenyl-1H-benzimidazol-2-yl)benzene, quinoxaline derivatives, triphenylquinoline, acridine derivatives, 2,6-bis(biphenyl)-4,8-diphenylanthrazoline, phenanthroline derivatives, and aluminum 8-hydroxyquinolinate.

The first carrier generation layer 31 may have a thickness of 5 to 20 nm, such as about 10 nm. The material of the first carrier generation layer 31 may be a metal, an oxide, an organic matter, and the like. For example, the material of the first carrier generation layer 31 may be the material of the electron transport layer doped with 1 to 10 wt % of metal lithium, while the material of the electron transport layer may comprise any one or a combination of 4,7-diphenyl-1,10-phenanthroline, 2,9-bis(naphth-2-yl)-4,7-diphenyl-1,10-phenanthroline, 2,9-dimethyl-4,7-diphenyl-1,10-phenanthroline, 2-(4-biphenylyl)-5-phenyl-1,3,4-ox adiazole, 2-(4-biphenylyl)-5-(4-t-butylphenyl)-1,3,4-oxadiazole, 3-(biphenyl-4-yl)-5-(4-t-butylphenyl)-4-phenyl-4H-1,2,4-triazole, 1,3,5-tris(1-phenyl-1H-benzimidazol-2-yl)benzene, quinoxaline derivatives, triphenylquinoline, acridine derivatives, 2,6-bis(biphenyl)-4,8-diphenylanthrazoline, phenanthroline derivatives, and aluminum 8-hydroxyquinolinate.

The first additional hole transport layer may have a thickness of about 10 nm, and the material thereof may comprise N,N'-diphenyl-N,N'-di(2-naphthyl)-1,1'-biphenyl-4,4'-diamine, and the like.

S206, forming a first blue light-emitting layer EB1 by an evaporation method.

That is, a blue light-emitting layer is formed in the pixel of each color by a method of vacuum deposition. It may have a thickness of about 25 nm, and the material thereof may be 3-t-butyl-9,10-di(2-naphthalene)anthracene doped with 2,5,8,11-tetra-t-butyl perylene, wherein the mass ratio of 3-t-butyl-9,10-di(2-naphthalene)anthracene to 2,5,8,11-tetra-t-butyl perylene may be 95:5.

S207, sequentially forming a second additional electron transport layer, a second carrier generation layer 32, and a second additional hole transport layer by an evaporation method.

That is, a second carrier generation layer 32 is formed in the pixel of each color by a method of vacuum deposition, and on both sides thereof, a second additional electron transport layer located under the second carrier generation layer 32 and a second additional hole transport layer located on the second carrier generation layer 32 are formed, respectively.

Here, the second additional electron transport layer may have a thickness of about 20 nm, and the material thereof may comprise any one or a combination of 4,7-diphenyl-1,10-phenanthroline, 2,9-bis(naphth-2-yl)-4,7-diphenyl-1,10-phenanthroline, 2,9-dimethyl-4,7-diphenyl-1,10-phenanthroline, 2-(4-biphenylyl)-5-phenyl-1,3,4-ox adiazole, 2-(4-biphenylyl)-5-(4-t-butylphenyl)-1,3,4-oxadiazole, 3-(biphenyl-4-yl)-5-(4-t-butylphenyl)-4-phenyl-4H-1,2,4-triazole, 1,3,5-tris(1-phenyl-1H-benzimidazol-2-yl)benzene, quinoxaline derivatives, triphenylquinoline, acridine derivatives, 2,6-bis(biphenyl)-4,8-diphenylanthrazoline, phenanthroline derivatives, and aluminum 8-hydroxyquinolinate.

The second carrier generation layer 32 may have a thickness of 5 to 20 nm, such as about 10 nm. The material of the second carrier generation layer 32 may be a metal, an oxide, an organic matter, and the like. For example, the material of the second carrier generation layer 32 may be the material of the electron transport layer doped with 1 to 10 wt % of metal lithium, while the material of the electron transport layer may comprise any one or a combination of 4,7-diphenyl-1,10-phenanthroline, 2,9-bis(naphth-2-yl)-4,7-diphenyl-1,10-phenanthroline, 2,9-dimethyl-4,7-diphenyl-1,10-phenanthroline, 2-(4-biphenylyl)-5-phenyl-1,3,4-oxadiazole, 2-(4-biphenylyl)-5-(4-t-butylphenyl)-1,3,4-oxadiazole, 3-(biphenyl-4-yl)-5-(4-t-butylphenyl)-4-phenyl-4H-1,2,4-triazole, 1,3,5-tris(1-phenyl-1H-benzimidazol-2-yl)benzene, quinoxaline derivatives, triphenylquinoline, acridine derivatives, 2,6-bis(biphenyl)-4,8-diphenylanthrazoline, phenanthroline derivatives, and aluminum 8-hydroxyquinolinate.

The second additional hole transport layer may have a thickness of about 10 nm, and the material thereof may comprise N,N'-diphenyl-N,N'-di(2-naphthyl)-1,1'-biphenyl-4,4'-diamine, and the like.

S208, forming a second blue light-emitting layer EB2 by an evaporation method.

That is, a second blue light-emitting layer EB2 is subsequently formed in the pixel of each color by a method of vacuum deposition. It may have a thickness of about 25 nm, and the material thereof may be 3-t-butyl-9,10-di(2-naphthalene)anthracene doped with 2,5,8,11-tetra-t-butyl perylene, wherein the mass ratio of 3-t-butyl-9,10-di(2-naphthalene)anthracene to 2,5,8,11-tetra-t-butyl perylene may be 95:5.

S209, forming a second functional layer by an evaporation method.

That is, an electron transport layer 41 and an electron injection layer 42 are sequentially formed in the pixel of each color by a method of vacuum deposition.

Here, the electron transport layer 41 may have a thickness of 25 nm, and the material thereof may be any one or a combination of 4,7-diphenyl-1,10-phenanthroline, 2,9-bis(naphth-2-yl)-4,7-diphenyl-1,10-phenanthroline, 2,9-dimethyl-4,7-diphenyl-1,10-phenanthroline, 2-(4-biphenylyl)-5-phenyl-1,3,4-oxadiazole, 2-(4-biphenylyl)-5-(4-t-butylphenyl)-1,3,4-oxadiazole, 3-(biphenyl-4-yl)-5-(4-t-butylphenyl)-4-phenyl-4H-1,2,4-triazole, 1,3,5-tris(1-phenyl-1H-benzimidazol-2-yl)benzene, quinoxaline derivatives, triphenylquinoline, acridine derivatives, 2,6-bis(biphenyl)-4,8-diphenylanthrazoline, phenanthroline derivatives, and aluminum 8-hydroxyquinolinate.

The electron injection layer 42 may have a thickness of about 1 nm, and the material thereof may be lithium fluoride, lithium 8-hydroxyquinolinate, and the like.

S210, forming a cathode 5 by an evaporation method.

That is, a cathode 5 is subsequently formed by an evaporation method. It may have a thickness of about 150 mn, and the material thereof may be metal aluminum and the like.

Of course, subsequent steps of forming other structures such as an enclosed layer may be further comprised, and detailed description is omitted hereby.

It can be understood that the above embodiments are merely exemplary embodiments used for illustrating the principle of this invention. However, this invention is not limited thereto. With respect to those of ordinary skill in the art, various variations and modifications can be made without departing from the spirit and the substance of this invention. These variations and modifications are also considered as the scope protected by this invention.

What is claimed is:

1. An organic light-emitting diode display substrate, wherein the organic light-emitting diode display substrate comprises a blue pixel and a first color pixel,
   wherein a first color light-emitting unit is provided in the first color pixel, and the first color light-emitting unit sequentially comprises a first electrode, a first functional layer, a first color light-emitting layer, a first carrier generation layer, a first blue light-emitting layer, a second carrier generation layer, a second blue light-emitting layer, a second functional layer, and a second electrode in a first direction, and comprises a first color filter for a first color light filtering through; and
   wherein a blue light-emitting unit is provided in the blue pixel, and the blue light-emitting unit sequentially comprises the first electrode, the first functional layer, the first carrier generation layer, the first blue light-emitting layer, the second carrier generation layer, the second blue light-emitting layer, the second functional layer, and the second electrode in the first direction.

2. The organic light-emitting diode display substrate according to claim 1, wherein:
   materials of the first carrier generation layer and second carrier generation layer are each independently a metal, an oxide, or an organic matter.

3. The organic light-emitting diode display substrate according to claim 1, wherein:
   materials of the first carrier generation layer and second carrier generation layer are each independently a material doped with 1 to 10 wt % of metal lithium and selected from the group consisting of 4,7-diphenyl-1,10-phenanthroline, 2,9-bis(naphth-2-yl)-4,7-diphenyl-1,10-phenanthroline, 2,9-dimethyl-4,7-diphenyl-1,10-phenanthroline, 2-(4-biphenylyl)-5-phenyl-1,3,4-oxadiazole, 2-(4-biphenylyl)-5-(4-t-butylphenyl)-1,3,4-oxadiazole, 3-(biphenyl-4-yl)-5-(4-t-butylphenyl)-4-phenyl-4H-1,2,4-triazole, 1,3,5-tris(1-phenyl-1H-benzimidazol-2-yl)benzene, quinoxaline derivatives, triphenylquinoline, acridine derivatives, 2,6-bis(biphenyl)-4,8-diphenylanthrazoline, phenanthroline derivatives, aluminum 8-hydroxyquinolinate, and combinations thereof.

4. The organic light-emitting diode display substrate according to claim 1, wherein:
   thicknesses of the first carrier generation layer and the second carrier generation layer are each independently between 5 and 20 nm.

5. The organic light-emitting diode display substrate according to claim 1, wherein the organic light-emitting diode display substrate further comprises a second color pixel, and
   wherein a second color light-emitting unit is provided in the second color pixel, and the second color light-emitting unit sequentially comprises the first electrode, the first functional layer, a second color light-emitting layer, the first carrier generation layer, the first blue light-emitting layer, the second carrier generation layer, the second blue light-emitting layer, the second functional layer, and the second electrode in the first direction, and comprises a second color filter for a second color light filtering through.

6. The organic light-emitting diode display substrate according to claim 1, wherein:
   the first electrode is an anode and the second electrode is a cathode; and
   the first functional layer comprises a hole injection layer and a hole transport layer, in which the hole injection layer is closer to the anode; and/or
   the second functional layer comprises an electron transport layer and an electron injection layer, in which the electron injection layer is closer to the cathode.

7. The organic light-emitting diode display substrate according to claim 6, wherein:
   a material of the hole injection layer is poly(3,4-ethylenedioxythiophene)-polystyrenesulfonic acid, polythiophene, or polyaniline.

8. The organic light-emitting diode display substrate according to claim 6, wherein:
   a material of the hole transport layer is an aromatic diamine compound, a triphenylamine compound, an aromatic triamine compound, a biphenyldiamine derivative, a triarylamine polymer, or a carbazole polymer.

9. The organic light-emitting diode display substrate according to claim 6, wherein:
   a material of the electron injection layer is lithium fluoride or lithium 8-hydroxyquinolinate.

10. The organic light-emitting diode display substrate according to claim 6, wherein:
    a material of the electron transport layer is selected from the group consisting of 4,7-diphenyl-1,10-phenanthroline, 2,9-bis(naphth-2-yl)-4,7-diphenyl-1,10-phenanthroline, 2,9-dimethyl-4,7-diphenyl-1,10-phenanthroline, 2-(4-biphenylyl)-5-phenyl-1,3,4-oxadiazole, 2-(4-biphenylyl)-5-(4-t-butylphenyl)-1,3,4-oxadiazole, 3-(biphenyl-4-yl)-5-(4-t-butylphenyl)-4-phenyl-4H-1, 2,4-triazole, 1,3,5-tris(1-phenyl-1H-benzimidazol-2-yl)benzene, quinoxaline derivatives, triphenylquinoline, acridine derivatives, 2,6-bis(biphenyl)-4,8- diphenylanthrazoline, phenanthroline derivatives, aluminum 8-hydroxyquinolinate, and combinations thereof.

11. The organic light-emitting diode display substrate according to claim 1, wherein:
the organic light-emitting diode display substrate further comprises a base, and
the first electrode is disposed at a position closer to the base than the second electrode is.

12. The organic light-emitting diode display substrate according to claim 1, wherein:
the blue pixel further comprises a blue color filter.

13. The organic light-emitting diode display substrate according to claim 1, wherein:
a first additional electron transport layer and a first additional hole transport layer are further provided on both sides of the first carrier generation layer respectively; and/or
a second additional electron transport layer and a second additional hole transport layer are further provided on both sides of the second carrier generation layer respectively.

14. The organic light-emitting diode display substrate according to claim 13, wherein:
a material of the first additional electron transport layer or the material of the second additional electron transport layer is selected from the group consisting of 4,7-diphenyl-1,10-phenanthroline, 2,9-bis(naphth-2-yl)-4,7-diphenyl-1,10-phenanthroline, 2,9-dimethyl-4,7-diphenyl-1,10-phenanthroline, 2-(4-biphenylyl)-5-phenyl-1,3,4-oxadiazole, 2-(4-biphenylyl)-5-(4-t-butylphenyl)-1,3,4-oxadiazole, 3-(biphenyl-4-yl)-5-(4-t-butylphenyl)-4-phenyl-4H-1,2,4-triazole, 1,3,5-tris(1-phenyl-1H-benzimidazol-2-yl)benzene, quinoxaline derivatives, triphenylquinoline, acridine derivatives, 2,6-bis(biphenyl)-4,8-diphenylanthrazoline, phenanthroline derivatives, aluminum 8-hydroxyquinolinate, and combinations thereof.

15. The organic light-emitting diode display substrate according to claim 13, wherein:
a material of the first additional hole transport layer or the material of the second additional hole transport layer comprises N,N'-diphenyl-N,N'-di(2-naphthyl)-1,1'-biphenyl-4,4'-diamine.

16. An organic light-emitting diode display apparatus, wherein the organic light-emitting diode display apparatus comprises:
the organic light-emitting diode display substrate of claim 1.

17. A production method of the organic light-emitting diode display substrate of claim 1, wherein:
the first color light-emitting layer is formed by a solution method; and
the first blue light-emitting layer and the second blue light-emitting layer are formed by an evaporation method.

18. The production method of an organic light-emitting diode display substrate according to claim 17, wherein:
the first electrode is an anode and the second electrode is a cathode;
the first functional layer comprises a hole injection layer and a hole transport layer, in which the hole injection layer is closer to the anode;
the second functional layer comprises an electron transport layer and an electron injection layer, in which the electron injection layer is closer to the cathode;
wherein the first functional layer is formed by a solution method; and
the second functional layer is formed by an evaporation method.

19. The production method of an organic light-emitting diode display substrate according to claim 17, wherein:
the first carrier generation layer and the second carrier generation layer are formed by an evaporation method.

20. The production method of an organic light-emitting diode display substrate according to claim 19, wherein:
a first additional electron transport layer and a first additional hole transport layer are further formed on both sides of the first carrier generation layer respectively by an evaporation method; and/or
a second additional electron transport layer and a second additional hole transport layer are further formed on both sides of the second carrier generation layer respectively by an evaporation method.

* * * * *